United States Patent [19]

Puar

[11] Patent Number: 4,739,191

[45] Date of Patent: Apr. 19, 1988

[54] DEPLETION-MODE FET FOR THE REGULATION OF THE ON-CHIP GENERATED SUBSTRATE BIAS VOLTAGE

[75] Inventor: Deepraj S. Puar, Sunnyvale, Calif.

[73] Assignee: Signetics Corporation, Sunnyvale, Calif.

[21] Appl. No.: 258,156

[22] Filed: Apr. 27, 1981

[51] Int. Cl.[4] .............................................. H03L 5/00

[52] U.S. Cl. ................................ 307/297; 307/296 R; 307/200 B

[58] Field of Search ............... 307/297, 296 A, 296 R, 307/304, 200 B; 323/313

[56] References Cited

U.S. PATENT DOCUMENTS

| | | | |
|---|---|---|---|
| 4,004,164 | 1/1977 | Cranford, Jr. et al. | 307/297 |
| 4,115,710 | 9/1978 | Lou | 307/297 X |
| 4,142,114 | 2/1979 | Green | 307/297 X |
| 4,296,340 | 10/1981 | Horan | 307/238.3 X |
| 4,322,675 | 3/1982 | Lee et al. | 307/297 X |

FOREIGN PATENT DOCUMENTS

| | | | |
|---|---|---|---|
| 2001494 | 1/1979 | United Kingdom | 307/297 |
| 2028553 | 3/1980 | United Kingdom | 307/297 |

OTHER PUBLICATIONS

Harroun, "Substrate Bias Voltage Control", *IBM Tech. Disc. Bull.*, vol. 22, No. 7, Dec. 1979, pp. 2691–2692.

Hummel, "Sentry Circuit for Substrate Voltage Control", *IBM Tech. Disc. Bull.*, vol. 15, No. 2, 6–1972, pp. 478–479.

Jacobson, "Threshold Detector", *IBM Tech. Disc. Bull.*, vol. 22, No. 7, 12–1979, pp. 2765–2767.

U.S. Defensive Publication T 954,006–Filed: 4/2/76–1/4/77, Inventor: James M. Lee (International Business Machines).

*Primary Examiner*—Stanley D. Miller
*Assistant Examiner*—D. R. Hudspeth
*Attorney, Agent, or Firm*—R. J. Meetin; J. Oisher; T. Briody

[57] ABSTRACT

An on-chip regulated substrate bias voltage generator for an MOS integrated circuit includes a ring oscillator (10) for developing a true signal and its complement. The signals are applied to a charge pump (12) that includes two capacitors (C1 and C2) and a plurality of rectifiers (22, 24, and 26). The charge pump produces a substrate bias voltage ($V_{BB}$) which is supplied to the gate of a depletion-mode field-effect transistor (28) whose source receives a reference voltage ($V_{SS}$). The transistor forms part of a control circuit (14) coupled to the ring oscillator. In the N-channel case, the charge pumping action on the substrate drives the substrate bias negative until it reaches the sum of the reference voltage and threshold voltage of the depletion-mode transistor. This enables the control circuit to control the operation of the ring oscillator so as to regulate the substrate bias voltage.

10 Claims, 1 Drawing Sheet

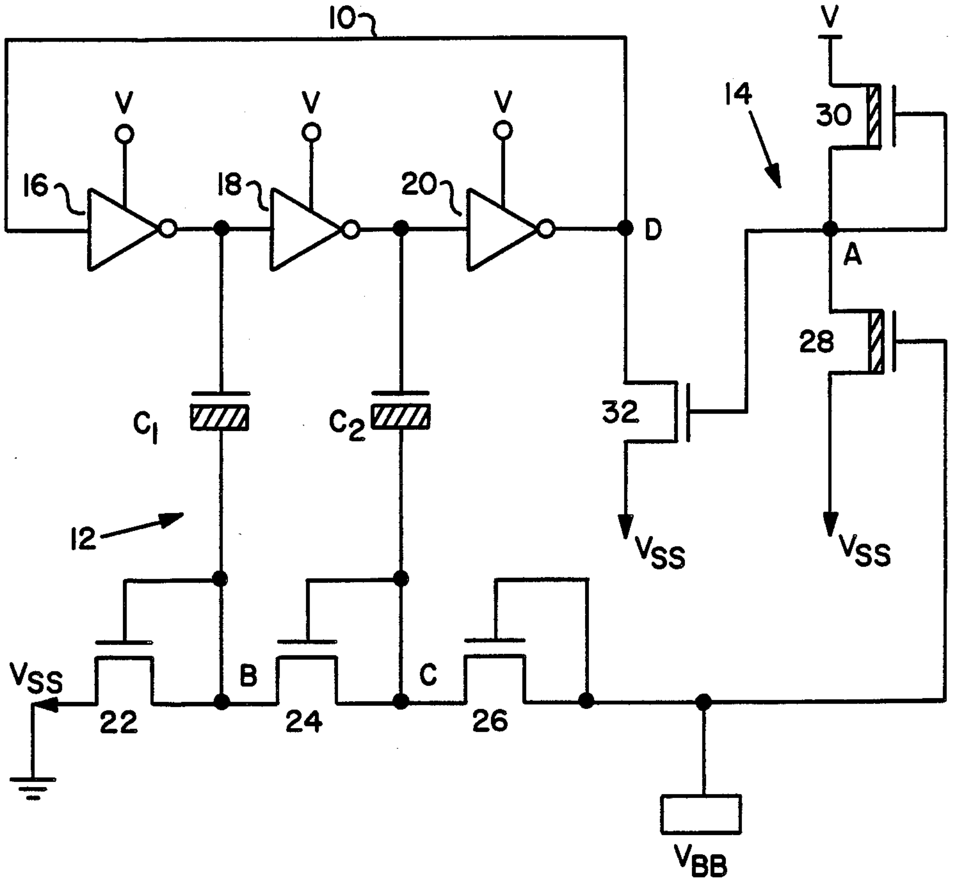
10
V
V
V
V
14
30
16
18
20
D
A
28
C1
C2
32
12
VSS
VSS
B
C
VSS
22
24
26
VBB

DEPLETION-MODE FET FOR THE REGULATION OF THE ON-CHIP GENERATED SUBSTRATE BIAS VOLTAGE

BACKGROUND OF THE INVENTION

This invention relates to on-chip generation of substrate bias voltage for semiconductor integrated circuit devices, and particularly by means for regulating the substrate bias voltage.

Some integrated circuits utilizing MOS (Metal Oxide Semiconductor) field effect transistors require a substrate bias to avoid unwanted conduction of parasitic junction diodes or parasitic MOS transistors. Substrate bias generators in common use generate the required bias from a charge pumping circuit that operates from the dc supply. Examples of some substrate bias generators and charge pumps are disclosed in the following:

U.S. Pat. No. 4,115,710
U.K. patent application No. GB 2,028,553A
U.K. patent application No. GB 2,001,494A
U.S. defensive publication No. T 954,006

Typically in the prior art circuits, the intent is to pump sufficient charge into the substrate until the threshold voltage of a MOS transistor, either depletion or enhancement type, equals a predetermined value and thereafter to maintain the threshold voltage at that value by controlling the charge pumping. Thus, while the threshold voltage may remain substantially fixed at the predetermined value, the substrate bias voltage is allowed to vary over a wide range to compensate for other variable factors which may affect the threshold voltage, such as operating temperature or process parameters.

SUMMARY OF THE INVENTION

According to the invention, there is provided a regulated substrate bias voltage generator for an integrated circuit that includes a depletion type field effect transistor.

A reference voltage is supplied to the source of the transistor. Consider the case in which the reference voltage is ground potential and the transistor is an N-channel device. Means are provided for developing a substrate bias voltage that can be altered between a value above and below the threshold voltage of the depletion type field effect transistor. Means are also provided for applying the substrate bias to the gate of the depletion type transistor to render it non-conducting when the gate voltage falls below the threshold voltage and to render it conducting when the gate voltage equals or exceeds the threshold voltage. Further, means are provided for coupling the transistor to the substrate bias generating means to increase the substrate bias when it falls below the threshold voltage of transistor and to decrease the substrate bias when it equals or exceeds the threshold voltage of the transistor.

In a specific embodiment of the invention a ring oscillator is used to generate a true signal and its complement which are applied to a charge pumping means. The charge pumping means pumps charge from the substrate until the substrate bias equals or exceeds the threshold voltage. The substrate bias is applied to the gate of the depletion type field effect transistor which forms part of a control circuit coupled to the ring oscillator. The control circuit regulates the substrate bias by stopping the ring oscillator when the bias has reached the threshold voltage and by turning on the ring oscillator when the substrate bias tends to rise above the threshold voltage. The components of the invention operate in the same way when the depletion type transistor is a P-channel device except that the voltage polarities are reversed.

BRIEF DESCRIPTION OF THE DRAWINGS

The single FIGURE is a schematic diagram of a substrate bias voltage generator and regulating means according to the invention.

DESCRIPTION OF THE PREFERRED EMBODIMENT

In the drawing there is shown a substrate bias voltage generator and regulating means for NMOS which comprises a ring oscillator 10, a charge pump 12, and a control circuit 14. The ring oscillator 10 includes an odd number of inverter stages, such as three stages of inverters 16, 18, 20, for example, for generating a true signal $\phi$ and its complement $\overline{\phi}$. The signals $\phi$ and $\overline{\phi}$ are rectangular in form and opposite in phase. The inverters 16, 18, 20 may each comprise a MOS pull-down transistor of the enhancement type coupled in series with a MOS pull-up load transistor of the depletion type connected as a resistor by having its gate coupled in common to its source. Other means for generating the signals $\phi$ and $\overline{\phi}$ besides the ring oscillator 10 may be used, the only requirement being that the signals be recurring, rectangular, equal in amplitude, and opposite in phase.

The signals $\phi$ and $\overline{\phi}$ are coupled through capacitors C1 and C2 to nodes B and C respectively of the charge pump 12. Other elements of the charge pump 12 include three enhancement mode transistors 22, 24, and 26 connected as diodes by having their respective gates coupled in common to their drains. The transistors 22, 24, 26 function as voltage level shifters, as will be explained. The transistors 22, 24, 26 are connected in series between a reference source supply $V_{SS}$, such as ground, and the node $V_{BB}$ at which the substrate bias voltage is generated.

The substrate bias control circuit 14 comprises three transistors 28, 30 and 32. The transistors 28 and 30 are depletion type and the transistor 32 is enhancement type. The depletion type transistors 28 and 30 are connected in series between reference source supply $V_{SS}$ and positive dc supply V, such as +5 volts dc. The gate of pull-down transistor 28 is connected directly to the substrate bias potential node $V_{BB}$, the source is connected to reference source supply $V_{SS}$, and the drain is connected to node A which is common to the source of pull-up transistor 30 and the gate of enhancement transistor 32.

The pull-up transistor 30 is connected as a resistor by having its gate connected to its source. Since the pull-up transistor 30 functions as load device, it may be replaced by an enhancement type transistor or simply a resistor. The source of enhancement transistor 32 is connected to reference source supply $V_{SS}$ and the drain is coupled to node D which is a common node in the feedback path between the input of the first inverter 16 and the output of the final inverter 20.

The operation of the substrate bias voltage generator and regulating means will now be described. When the supply voltage V is applied to the circuit, the substrate bias potential at node $V_{BB}$ is initially close to ground potential. As a result, the pull-down depletion transistor 28 is in its low impedance or conducting state. By choosing the impedance of pull-up depletion transistor 30 to be much larger than that of pull-down depletion transistor 28, common node A is kept near ground potential.

As a result of node A being low or at ground potential, the enhancement transistor 32 is in its high impedance or non-conducting state and the ring oscillator 10 comprised of inverters 16, 18, 20 will be allowed to oscillate. Thus at the plates of the capacitors C1 and C2, the signal pulses $\phi$ and $\overline{\phi}$ will appear as voltage swings of 0 to +5 volts and +5 volts to 0 respectively.

The 5 volt voltage swings on one side of each capacitor will appear on the opposite side thereof as 4 volt swings, reduced by one volt because of parasitic capacitances at nodes B and C respectively. Due to the presence of the transistors 22,24, 26, a level shifting occurs at nodes B, C, and $V_{BB}$. Thus when node B goes positive, it will cause transistor 22 to conduct when the gate reaches its threshold potential, which is about 1 volt positive relative to its source which is at ground potential. The potential at node B thus can go no further positive than one threshold voltage drop above $V_{SS}$.

At the end of the first half cycle of the signal pulse $\phi$, when it goes negative, node B will change in the negative direction by 4 volts, thus dropping from +1 volt to −3 volts.

In similar fashion a 5 volt swing imposed on capacitor C2 by the complementary signal pulse $\overline{\phi}$ will be translated to a 4 volt swing at node C which is equal and opposite in phase to the 4 volt swing on node B. Since node C can go no further positive than one threshold voltage drop relative to node B, by virtue of conduction of transistor 24, node C on its positive swing is limited to −2 volts. On its negative swing, therefore it will change by 4 volts to a maximum of −6 volts.

The 4 volt swing on node C is translated to a corresponding 4 volt swing at the drain of transistor 26, which is connected to the substrate bias node $V_{BB}$. Thus, a voltage swing between −2 and −6 volts on node C would tend to be translated to a voltage swing, unregulated between −1 and −5 volts at $V_{BB}$ because $V_{BB}$ is one threshold voltage drop above node C. However, as the voltage at $V_{BB}$ approaches −3 volts, which is the threshold voltage for the depletion transistor 28, whose gate is tied to $V_{BB}$, the depletion transistor 28 starts to go into its high impedance or cut-off state, and node A starts to charge towards the supply voltage V through transistor 30.

When the potential on node A is high enough to switch transistor 32 into its low impedance or ON state, then the potential on node A is held close to ground potential, thereby causing the ring oscillator 10 to stop oscillating. The charge pumping action then stops and the potential on node $V_{BB}$ does not go further negative than −3 volts.

Since all the reverse biased junction leakages on the chip are from various positively charged circuit nodes to $V_{BB}$, the potential on node $V_{BB}$ will then start moving positive until it causes transistor 28 to go into its low impedance state once again. This in turn causes the potential on node A to drop, thus putting transistor 32 into its high impedance state. The ring oscillator starts to oscillate again until the potential on $V_{BB}$ is sufficiently negative to cause transistor 28 to go into its high impedance state once more. The voltage regulation cycle repeats itself and results in a substrate bias voltage that is close to the depletion threshold voltage of transistor 28, which is very close to −3 volts.

The circuit of the invention may also be used for PMOS by inverting the polarity of the supply voltages $V_{SS}$ and V.

Although the best mode contemplated for carrying out the present invention has been shown and described, it will be apparent that modification and variation may be made without departing from what is regarded to be the subject matter of the invention.

What is claimed is:

1. In an integrated circuit having a semiconductor substrate, a voltage generator for providing a substrate bias voltage for the substrate, the voltage generator comprising:

a depletion-mode field-effect transistor having a source for receiving a reference voltage, a gate for receiving the bias voltage, and a drain;

a ring oscillator comprising an odd number of at least three inverters serially arranged in a ring, the inverters providing a pair of complementary signals that repetitively vary when the transistor is conductive;

a charge pump responsive to the complementary signals as they repetitively vary for pumping the bias voltage to a value (1) less than the sum of the reference voltage and the threshold voltage of the transistor where it is N-channel type or (2) greater than the sum of the reference voltage and the threshold voltage of the transistor where it is P-channel type: and means for stopping the oscillator from oscillating when the transistor is non-conductive so that the bias voltage (1) increases where the transistor is N-channel type or (2) decreases where the transistor is P-channel type.

2. A voltage generator as in claim 1 wherein the means for stopping disables the oscillator in response to the voltage at the drain of the transistor when it is non-conductive.

3. A voltage generator as in claim 2 wherein the means for stopping comprises a like-polarity enhancement-mode field-effect transistor having a source for receiving the reference voltage, a gate coupled to the drain of the depletion-mode transistor, and a drain coupled to the oscillator.

4. A voltage generator as in claim 3 further including a load device coupled to the drain of the depletion-mode transistor.

5. A voltage generator as in claim 4 wherein the load device comprises a like-polarity resistively-connected depletion-mode field-effect transistor.

6. A voltage generator as in claim 4 wherein the load device comprises a resistor.

7. A voltage generator as in claim 4 wherein one of the complementary signals is provided from a node between one pair of the inverters, the other of the complementary signals is provided from a node between another pair of the inverters, and the drain of the enhancement-mode transistor is coupled to a node between a pair of the inverters.

8. A voltage generator as in claim 2 wherein the charge pump comprises:

a first rectifier having one end coupled to a voltage supply;

a second rectifier having one end coupled to the other end of the first rectifier so as to be forwardly in series therewith, the other end of the second rectifier being coupled to a substrate node at which the bias voltage is provided to the substrate;

a first capacitor having a pair of plates of which one is coupled to one end of the second rectifier and the other receives one of the complementary signals; and a second capacitor having a pair of plates of which one is coupled to the other end of the second rectifier and the other receives the other of the complementary signals.

9. A voltage generator as in claim 8 wherein the charge pump further includes a third rectifier forwardly coupled between the second rectifier and the substrate node.

10. A voltage generator as in claim 9 wherein each rectifier is a like-polarity diode-connected field-effect transistor.

* * * * *